United States Patent
Beck et al.

(10) Patent No.: US 7,372,685 B2
(45) Date of Patent: May 13, 2008

(54) MULTI-FAULT PROTECTED HIGH SIDE SWITCH WITH CURRENT SENSE

(75) Inventors: Riley D. Beck, Eagle Mountain, UT (US); Matthew A. Tyler, Bountiful, UT (US)

(73) Assignee: ON Semiconductor, Phoenix, AZ (US)

( * ) Notice: Subject to any disclaimer, the term of this patent is extended or adjusted under 35 U.S.C. 154(b) by 182 days.

(21) Appl. No.: 10/442,630

(22) Filed: May 20, 2003

(65) Prior Publication Data
US 2004/0233604 A1  Nov. 25, 2004

(51) Int. Cl.
*H03K 17/567* (2006.01)
*H03K 17/687* (2006.01)
*H03K 17/66* (2006.01)
*H03K 17/68* (2006.01)

(52) U.S. Cl. .................. 361/93.1; 327/434; 327/436; 327/437

(58) Field of Classification Search ............. 361/93.1, 361/93.7, 98; 327/434, 436, 437
See application file for complete search history.

(56) References Cited

U.S. PATENT DOCUMENTS

| | | | |
|---|---|---|---|
| 4,750,079 A | 6/1988 | Fay et al. | 361/101 |
| 5,184,272 A | 2/1993 | Suda et al. | 361/87 |
| 5,372,410 A * | 12/1994 | Miller et al. | 303/122.05 |
| 5,396,117 A | 3/1995 | Housen et al. | 327/480 |
| 5,438,489 A * | 8/1995 | Judy et al. | 361/191 |
| 5,459,732 A * | 10/1995 | Wise et al. | 701/76 |
| 5,621,601 A | 4/1997 | Fujihira et al. | 361/93 |
| 6,011,413 A | 1/2000 | Hayakawa et al. | 327/51 |
| 6,028,438 A | 2/2000 | Gillette | 324/765 |
| 6,154,012 A * | 11/2000 | Drori | 320/162 |
| 6,160,304 A * | 12/2000 | Ludikhuize | 257/549 |
| 6,259,306 B1 * | 7/2001 | Brulhart et al. | 327/436 |
| 6,323,703 B1 * | 11/2001 | Fotouhi | 327/112 |
| 6,330,143 B1 | 12/2001 | Maly et al. | 261/101 |
| 6,407,532 B1 | 6/2002 | Ruha | 320/128 |
| 6,509,781 B2 * | 1/2003 | Dufort | 327/434 |
| 6,678,829 B1 * | 1/2004 | Teggatz et al. | 713/300 |
| 6,836,148 B2 * | 12/2004 | Pullen et al. | 326/81 |
| 2002/0024376 A1 | 2/2002 | Sander | 327/407 |

OTHER PUBLICATIONS

A. Sedra, Microelectronic Circuits, 1987, Holt, Rine and Winston, 2nd edition, pp. 342-345.*
Horowitz et al. The Art of Electronics, 1989, Cambridge Ubniversity Press, pp. 117-118.*

* cited by examiner

*Primary Examiner*—Michael Sherry
*Assistant Examiner*—Zeev Kitov
(74) *Attorney, Agent, or Firm*—Workman Nydegger

(57) ABSTRACT

An integrated high side switch with multi-fault protection. When a fault condition is detected, the switch is turned off. The switch includes a pair of transistors that are connected such that the source of the first transistor is connected with the source of the second transistor. The drain of the first transistor is thus connected to the supply voltage. A first current mirror generates a current sense output. A second current mirror generates an internal current to detect an over current fault condition. The transistors in the current mirrors are connected like the switch transistors. A high voltage operational amplifier and a transistor are used as feedback to insure that the voltage at the output of the current mirrors matches the voltage at the output of the switch. This ensures that the current mirrors generate scaled versions of the current flowing through the switch.

30 Claims, 8 Drawing Sheets

MULTI-FAULT PROTECTED HIGH SIDE SWITCH WITH CURRENT SENSE

BACKGROUND OF THE INVENTION

1. The Field of the Invention

The present invention relates to integrated electronics. More particularly, the present invention relates to an integrated semiconductor high side switch with multi-fault protection.

2. Background and Relevant Art

Vehicles today are becoming significantly more complex and sophisticated. Much of the complexity and sophistication can be attributed to the electrical nature of vehicles. Modern automotive electronic systems, for instance, monitor or control many aspects of a vehicle's operation. Automotive electronic systems use various sensors (resistive sensors, inductive sensors, pressure sensors, and the like) to detect and monitor operational parameters such as fuel mixture, vehicle speed, engine temperature, safety mechanisms, and the like. Automotive electronic systems use the data collected by the various sensors to control and operate the respective electronic systems.

When an electronic system is designed for a vehicle, there are several problems that should be addressed. For instance, automotive electronic systems operate in a harsh environment that cannot be readily changed. Thus, electronic systems used in vehicles must survive the environment and be able to withstand extreme temperatures, nearly constant vibrations, and other physical jolts. In addition, automotive electronic systems may also be subject to extreme voltages (both high and low voltages) and short circuits to either ground or other voltage levels.

Another problem faced by automotive electrical systems is related to the need to interface a relatively large number of sensors with a microprocessor or other control system. As a general rule, it is not practical for the microprocessor to monitor all of the sensors in real time. Thus, the microprocessor samples the sensors periodically or based on current operating conditions of the vehicle. It is therefore desirable to turn the various sensors on and off rapidly. Mechanical switches are an inadequate solution for turning the sensors on and off rapidly because they are both too slow and too expensive. Electro-mechanical switches, on the other hand, have relatively short life spans, which makes them a less than ideal solution.

The need to turn a sensor on and off quickly is not the only electrical problem faced by automotive electrical systems. There are a variety of different fault conditions that can occur such as extreme voltages, short circuits to both high and low voltages, current surges, and the like. A properly designed electrical system should survive the various fault conditions and isolate other electronics that may be affected by the fault conditions. A properly designed electrical system insures that current, for example, does not flow back into a voltage supply and that voltage spikes do not harm the electrical system.

These problems are particularly present at switches that are used to turn the sensors on and off repeatedly. Not only should the sensors, supply voltages, or other electrical devices be protected from fault conditions, but the switches also need to be protected from the fault conditions themselves. One solution to these problems in use today is to provide a number of discrete electronic components that both customize the interface with the sensor or other electrical device and that protect the sensors from various fault conditions that may occur during operation of a vehicle. The use of discrete components, however, presents a potential problem in reliability because the severe operating environment of vehicles may have an adverse impact on one or more of the discrete components. The use of discrete components also raises the cost of this solution. What would be advantageous is a system or method that provides protection for various fault conditions without relying on discrete components. This type of approach would lower cost and improve reliability.

BRIEF SUMMARY OF THE INVENTION

These and other limitations are overcome by the present invention which relates to an integrated semiconductor device. More particularly, the present invention relates to an integrated high side switch that provides protection from multiple fault conditions. One embodiment of the present inventions is an integrated high side switch that provides protection from an over current fault condition, a short to battery fault condition or other short circuit fault conditions, and an over voltage fault condition while providing a current sense output.

In one embodiment of the invention, an integrated semiconductor device includes a high side switch. The switch has a high voltage lateral DMOS transistor and an extended drain PMOS transistor that can tolerate higher voltages that occur in some fault conditions. The series connection of the transistors permits a higher reverse battery connection across the high side switch. In typical configurations, the supply voltage is connected with the source of the lateral DMOS transistor. In this embodiment, however, an extended drain PMOS transistor is placed in series with the lateral DMOS transistor. The extended drain device is reversed such that the drain is connected with the supply voltage. Thus, the source of the first transistor is connected with the source of the second transistor.

Additional transistors connected in a similar manner as the transistors in the high side switch are configured to mirror the current flowing through the switch. A first current mirror is configured to generate a current sense that can be used to monitor the current delivered to a load through the switch. A second current mirror is configured to monitor the current flowing through the switch. The second current mirror is used to generate an over current signal that causes the switch to be shut off in the event that excessive current is detected. A feedback circuit insures that the voltage at the output of the switch and that the voltages at the outputs of the current mirrors are equal. The feedback circuit thus ensures that a scaled copy of the current of the switch is delivered through each current mirror.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention relates to an integrated semiconductor device that includes a high side switch. The present invention further relates to an integrated multi-fault protected high side switch. One advantage of the present invention is that the integrated semiconductor device is a single component that is less expensive than discrete components and that is more accurate than several discrete components implemented at a board level. The integrated semiconductor device described herein is typically more reliable than a group of discrete components.

The present invention is described in terms of an automotive environment, although one of skill in the art can appreciate that the present invention can be applied in other electrical applications or environments and is not limited to automotive applications or environments. A high side switch typically refers to the fact that the switch is placed or located between a high potential or supply voltage and the load to which the supply voltage delivers power.

Figure 1:
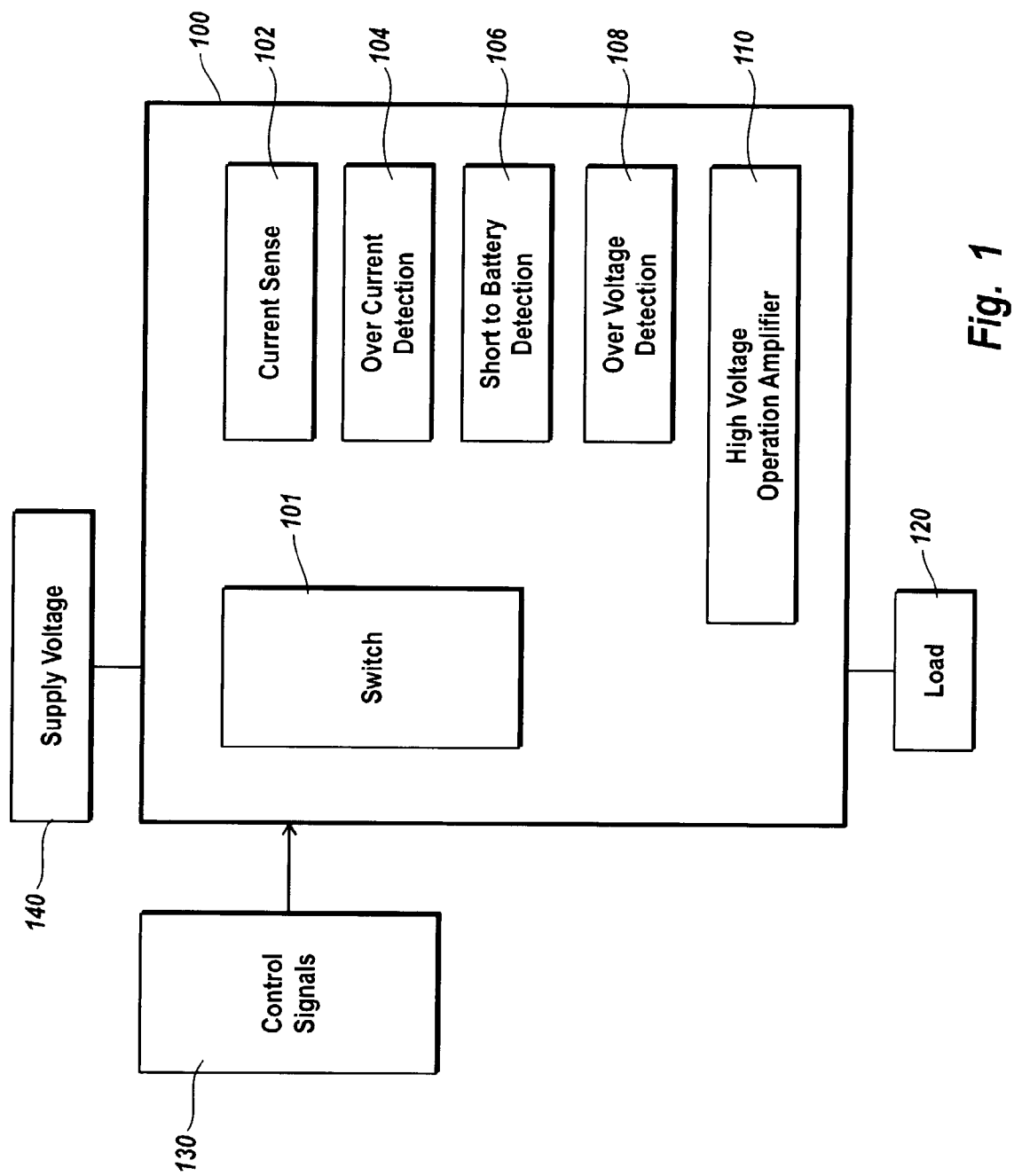
FIG. 1 is a block diagram of an integrated high side switch that provides protection from multiple fault conditions including over current detection, short to battery detection, and over voltage detection.

FIG. 1 is a block diagram that illustrates an integrated semiconductor device that includes a multi-fault protected high side switch. In other words, the high side switch as well as other electronic components such as the supply voltage or the load, can be protected from various fault conditions. In one embodiment, the integrated semiconductor device 100 provides a current sense output 102, over current detection 104, short to battery detection 106, and over voltage detection 108. The integrated semiconductor device 100 also includes a high voltage operational amplifier 110 that can survive various fault conditions.

The integrated semiconductor device 100 is usually configured to deliver power or current to a load 120 when the switch 101 is engaged or on. The load 120 can be, for example, a sensor or other electronic device. The integrated semiconductor device 100 receives control signals 130 through control inputs. The control signals turn the switch 101 on or off. The control signals 130 are typically received through a high output impedance level shifter in one embodiment.

The ability to turn the high side switch 101 on and off is often useful in the operation of the load 120. The load 120, for example, may be a sensor that is sampled periodically. As previously stated, however, fault conditions may occur and it is often necessary to protect the high side switch 101, a power source to the high side switch 101 such as the supply voltage 140, or the load 120 from these fault conditions that can potentially cause significant damage. The integrated semiconductor device 100 is also protected from the fault conditions that may occur during operation.

The integrated semiconductor device 100 includes a current sense 102 that is fully integrated with the semiconductor device 100 in this embodiment. Typically, the output of the current sense 102 is smaller than the current delivered to the load 120 through the switch 101 by some factor. Usually, the output of the current sense 102 is typically measured by a microprocessor. The current sense 102 can then be used to monitor the current that is delivered to the load 120. For example, the current fluctuations of the current sense 102 can be interpreted by a microprocessor and used to monitor or control operational parameters of the vehicle.

The over current detection 104 is also integrated with the semiconductor device 100 in this example. The over current detection 104 protects the integrated semiconductor device 100 from delivering potentially damaging currents to the load 120 or from currents that the integrated semiconductor device 100 cannot handle. High currents, for example, often produce significant heat that can breech the thermal limits of the integrated semiconductor device 100. To protect against this fault condition, the over current detection 104 measures a current that is also a scaled version of the current delivered through the switch 101. The current used by the over current detection 104 can be small as it is internal to the switch 100. The current detected by the over current detection 104 is measured and when the current reaches a threshold, the high side switch is turned off. The over current detection 104 can ensure that the switch 101 does not carry a current that would damage the integrated semiconductor device 100.

The short to battery detection 106 is configured to protect the integrated semiconductor device 100 or other electrical devices from a short circuit fault condition. A short to battery fault condition occurs, for example, when the output of the high side switch 101 becomes shorted to an external battery supply or to any voltage that is higher than the supply voltage of the high side switch 101. Automotive electrical systems typically contain circuitry that would be damaged by the voltage delivered by a standard 12 volt supply. Thus, many of the electronic systems in vehicles have a regulated voltage that should deliver a safe and consistent voltage. In other words, the supply voltage to a particular sensor may be regulated at 5 volts. The short to battery fault condition is dangerous because the high side switch 101 cannot determine which way current is flowing. Thus, current could be fed into the regulated supply, thereby damaging the supply, the switch, and/or other components using the regulated supply. The short to battery detection 106 detects this condition and generates a signal that causes the integrated semiconductor device 100 to be shut off.

The over voltage detection 108 protects against excessive voltages that can occur. An excessive voltage may appear, for example, during a load dump. A load dump occurs when current moving through a wire is suddenly shut off. This quick interruption creates a momentary voltage increase that could damage circuitry in the electrical systems of the vehicle including the integrated semiconductor device described herein. This type of problem may occur, for example, when a dead battery is "jump-started." The integrated semiconductor device 100 also utilizes a high voltage operational amplifier 110 that can survive the extreme voltages experienced during the various fault conditions.

Figure 2:
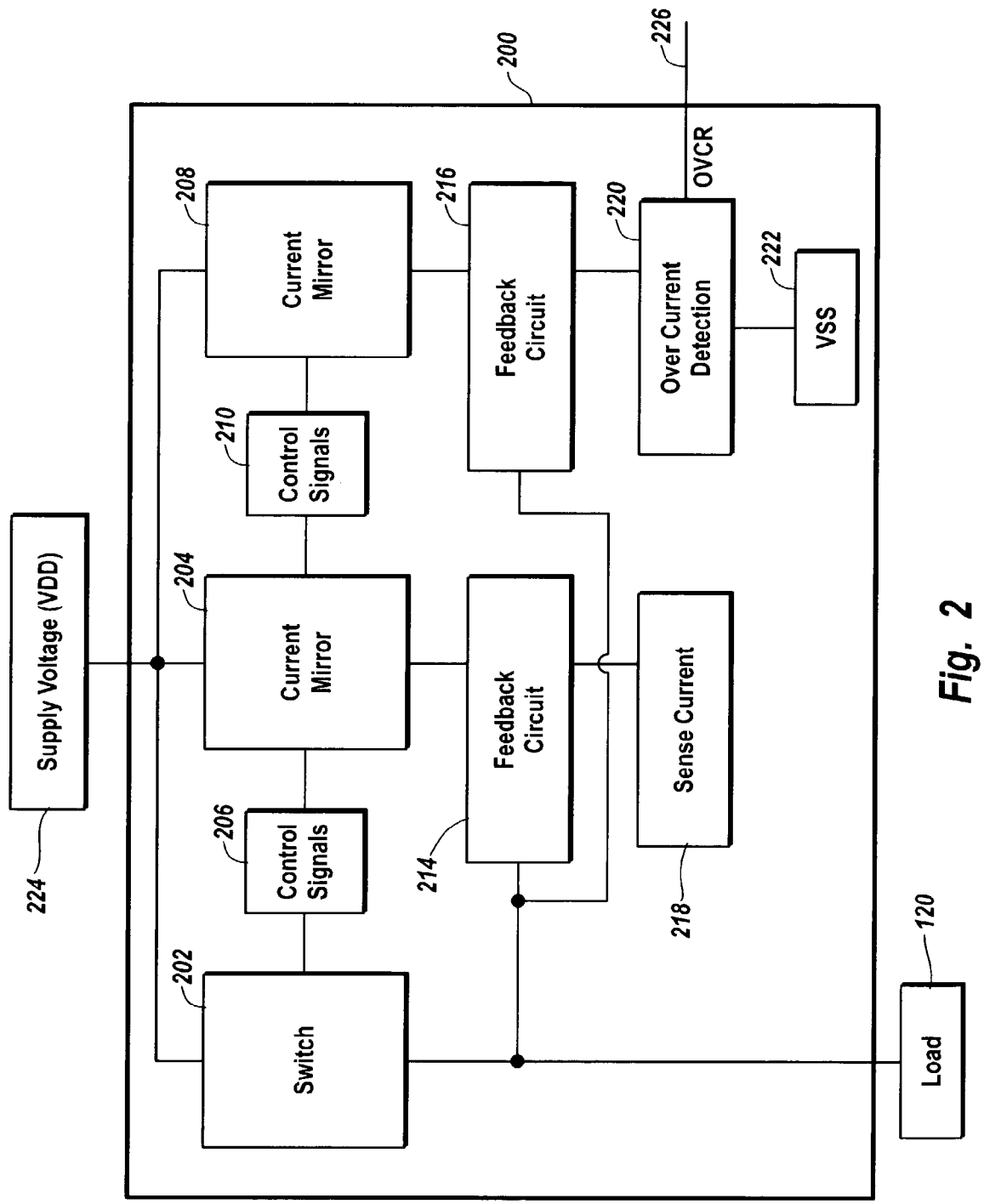
FIG. 2 is a block diagram of an integrated high side switch and a pair of current mirrors that generate scaled versions of current delivered through the switch.

FIG. 2 is a block diagram that illustrates one embodiment of an integrated semiconductor device 200 with multi-fault protection. The integrated semiconductor device 200 receives power from a supply voltage 224 (VDD) and is also connected with ground or a negative supply represented by VSS 222 (which may be ground). The control signals 206 and 210 are usually generated by a microprocessor and are used to control the switch 202, the current mirror 204, and the current mirror 208. More specifically, the control signals 206 and 210 turn the switch 202 and the current mirrors 204, 208 on and off. In one embodiment, the control signals 206 and 210 are the same control signals. The output impedance of the control signals is typically large in order to protect, for example, the microprocessor during a fault condition when current may flow into the microprocessor or to the supply voltage through the control signals. When the switch 202 is turned on, the switch 202 becomes a resistive path that delivers current to a load 120. When the switch 202 is turned off, the load 120 does not receive current.

A current mirror 204 is included in the integrated semiconductor device 200 and is also controlled by the control signals 206. The current mirror 204 generates a sense current 218. To ensure that the sense current 218 is a scaled version of the load current delivered through the switch 202, a feedback circuit 214 is connected between the switch 202 and the current mirror 204. The feedback circuit 214 ensures that the voltage at the output of the switch 202 and the voltage at the output of the current mirror 204 are the same. This permits the sense current to be a scaled by a predetermined factor. In one embodiment, the sense current 218 is scaled by a factor of 10.

The current mirror 208 is also integrated into the semiconductor device 200 and is controlled by the control signals 210. The current generated by the current mirror is used by the over current detection 220 to provide protection against an over current fault condition. The feedback circuit 216 ensures that the voltage at the output of the switch 202 is matched to the voltage at the output of the current mirror 208. Because the over current detection 220 is integrated with the high side current switch 200, the current mirror 208 can scale the current through the switch 202 by a larger factor. In one embodiment, the current mirror 208 scales the switch current by a factor of 105. The over current detection 220 monitors the current of the current mirror 208 and if the current of the current mirror 208 exceeds a certain level, then an OVCR signal 226 is generated. A microprocessor or other control logic, upon receiving the OVCR signal 226, generates the necessary control signals to turn the switch 202, the current mirror 204, and the current mirror 208 off.

The control signals 206, 210 may be generated using combinational logic or by a microprocessor. As described below, the integrated semiconductor device generates outputs that indicate fault conditions. The outputs generated by the semiconductor device 200 are provided as inputs to the microprocessor or combinational logic. When one or more of these signal outputs is asserted, the control signals are changed to turn the integrated semiconductor device off. The control signals 206, 210 are generated, in one embodiment, using level shifters. In order to prevent the level shifters from providing a path back to the supply voltage in a short to battery (STB) fault condition, the level shifters typically have a large output impedance.

Figure 3A:
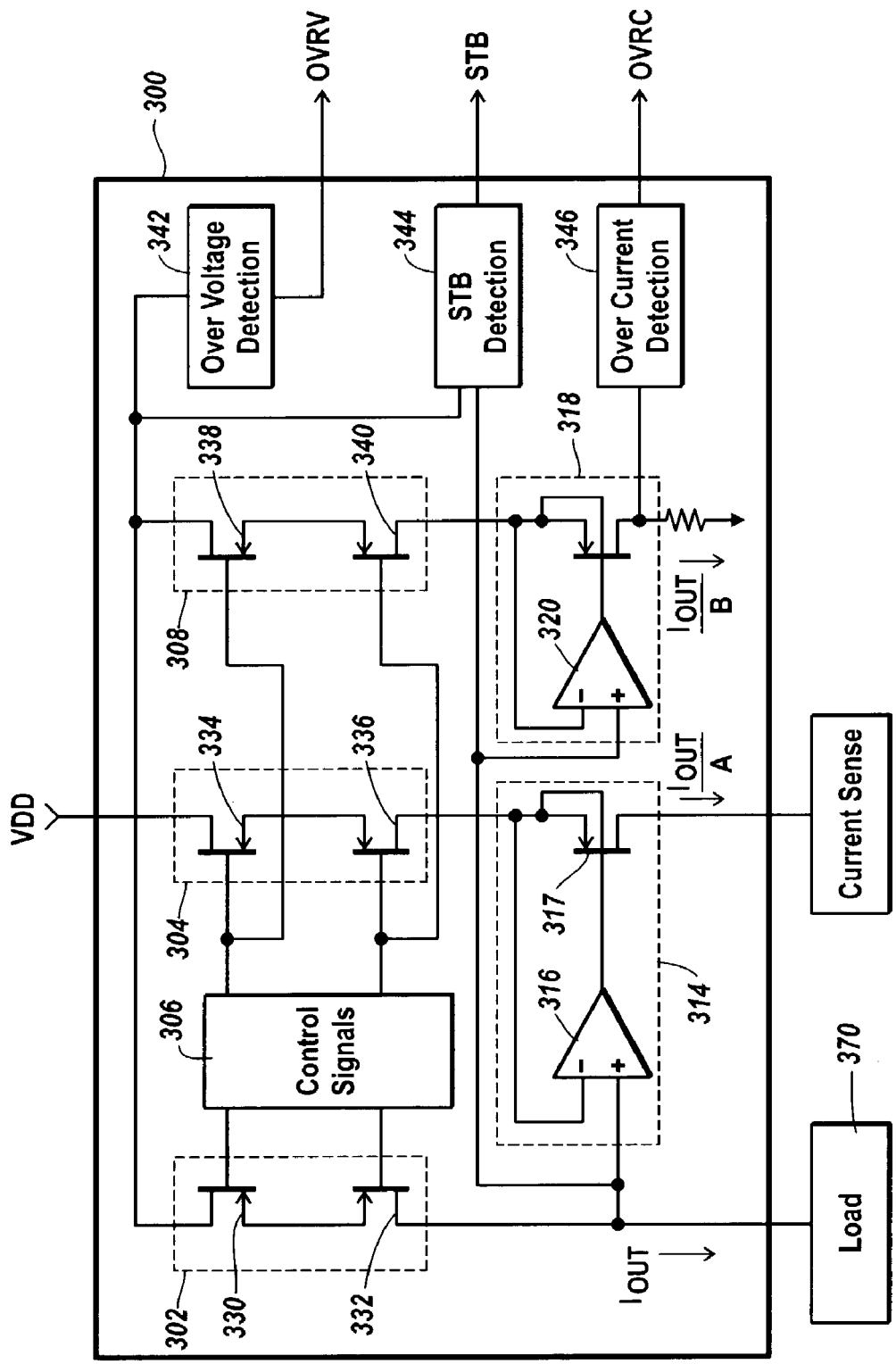
FIG. 3A is one embodiment of a high side switch with current sense, over current detection, short to battery detection, and over voltage detection.

FIG. 3A is a block diagram of an exemplary embodiment of the present invention. The integrated semiconductor device 300 provides a high side switch 302. The switch 302 includes a lateral DMOS and a High Voltage extended drain PMOS transistors 330 and 332 connected in series between the supply voltage VDD and the load 370. In this example, the transistor 330 is not connected in a traditional manner. Rather, the drain of the extended drain PMOS 330 is connected with the supply voltage VDD and the source of the transistor 330 is connected with the source of the lateral DMOS 332. This effectively permits a double side protected transistor to be formed from two single side protected transistors. In addition, the transistors 330 and 332 require less substrate area. Currently, the on-state resistance of the transistors 330 and 332 would normally include a symmetrical double extended transistor that is almost four times the size of its non-extended counterpart. This embodiment, however, uses only approximately twice the area of its non-extended counterpart. Thus, there is a savings in die area and this embodiment provides the same level of high voltage protection as a double extended device. The transistors 330 and 332 are turned on and off by the control signals 306. The transistors 334 and 336 form a current mirror 304 while the transistors 338 and 340 form a current mirror 308. The transistors 334, 336, 338, and 340 are also PMOS transistors in one embodiment and are turned on and off by the control signals. The transistors 334 and 336 are connected at their respective sources. The transistors 338 and 340 are similarly connected.

Figure 3B:
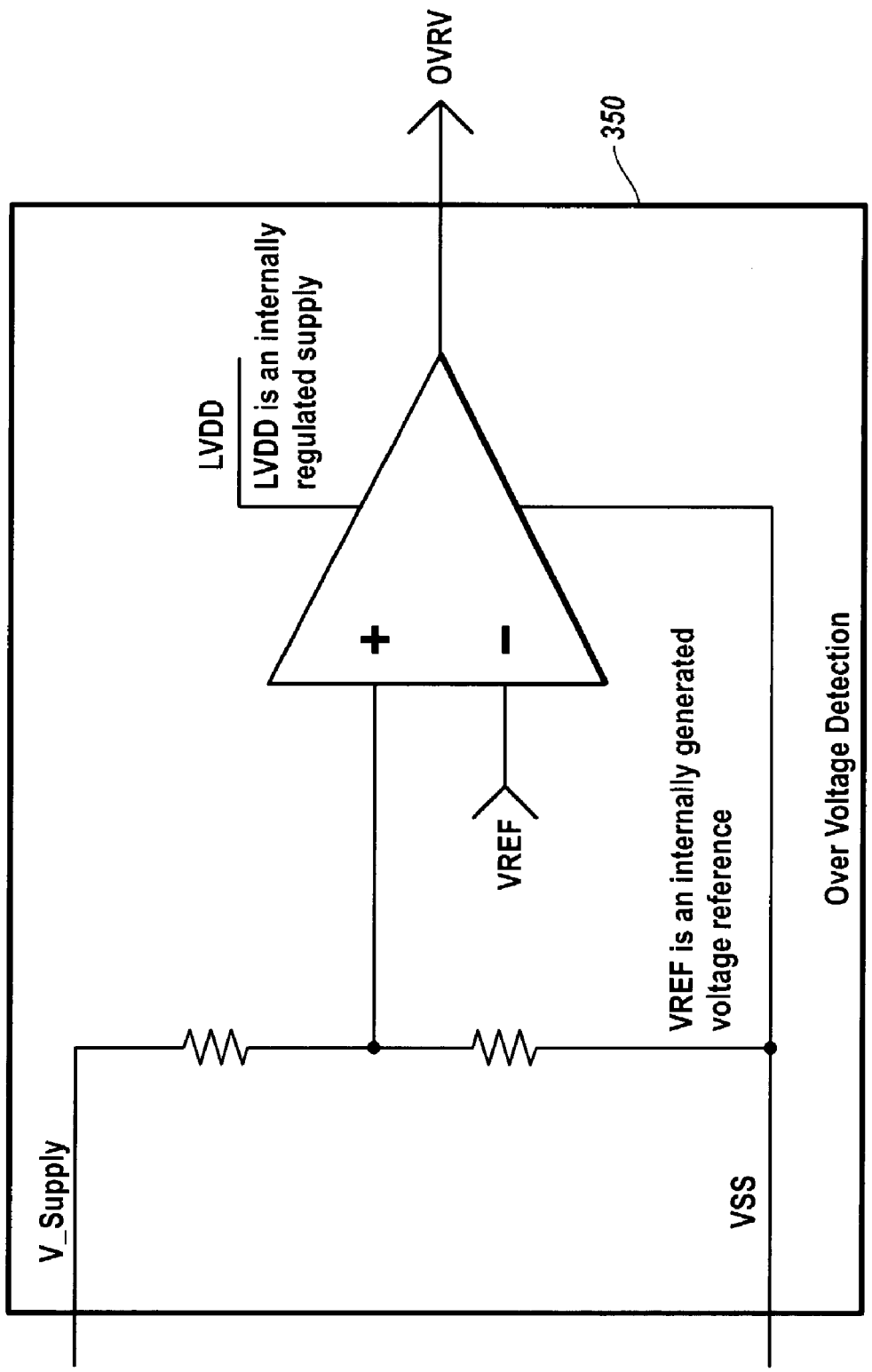
FIG. 3B is one embodiment of an over voltage detection circuit that is integrated with a high side switch.
Figure 3C:
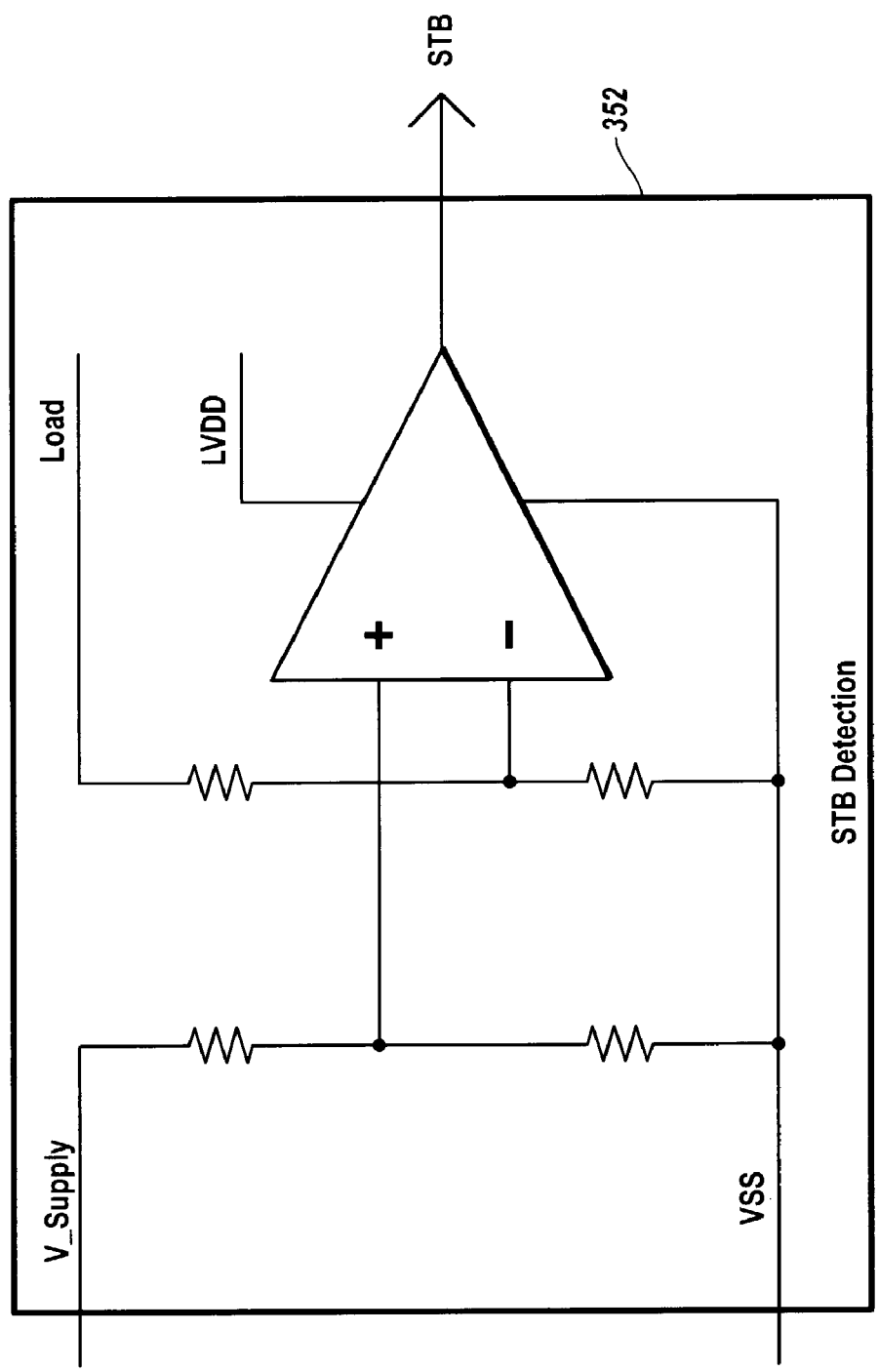
FIG. 3C illustrates one embodiment of a short to battery detection circuit that is integrated with a high side switch.
Figure 3D:
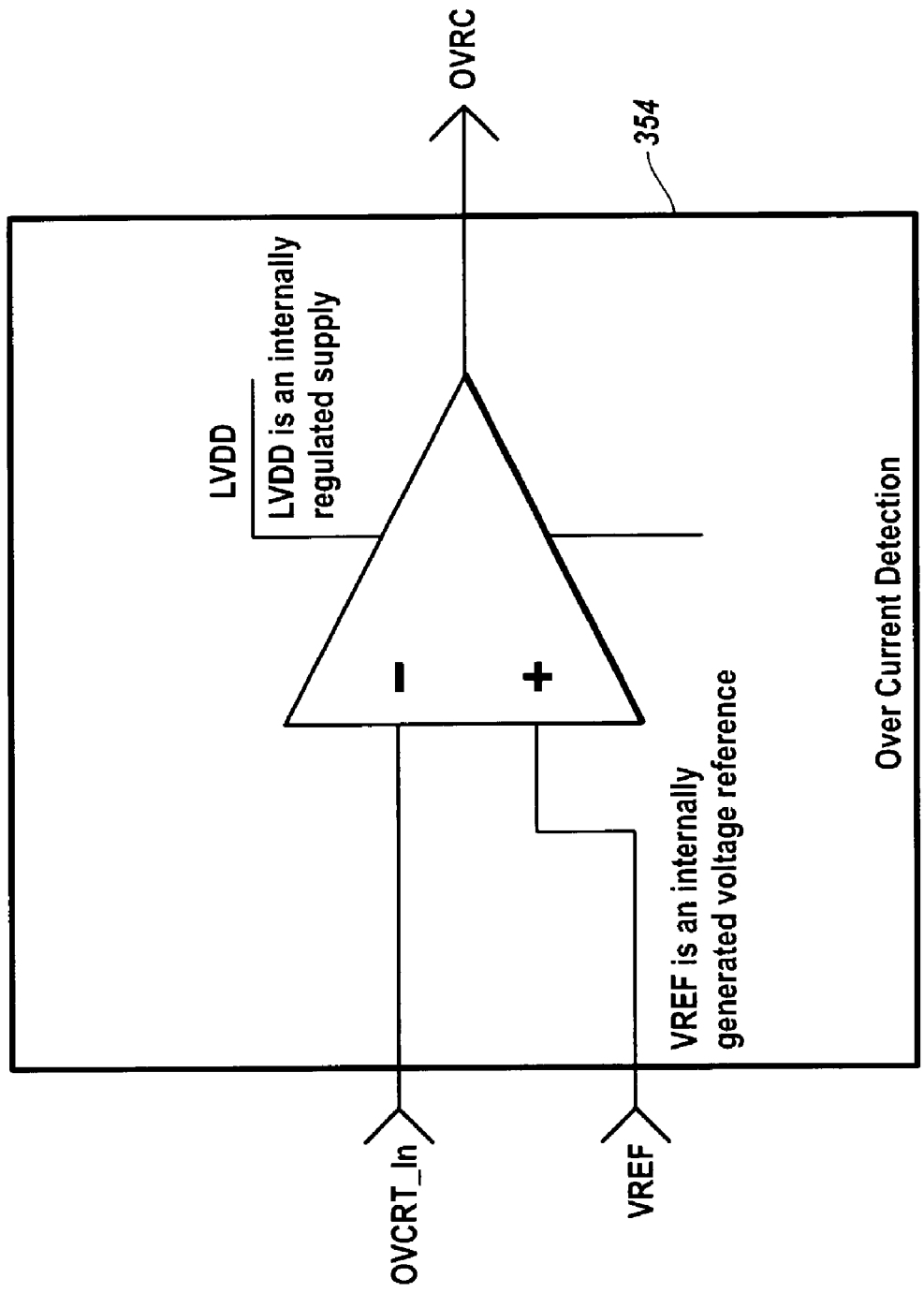
FIG. 3D illustrates one embodiment of an over current detection circuit that is integrated with a high side switch.

FIGS. 3B through FIG. 3D illustrate examples of circuitry that is used to indicate the presence of a fault condition to a microprocessor or other control system. When a fault condition is detected, the control logic that receives the signals generated by the circuitry illustrated in FIGS. 3B through 3D generates the control signals that turn the switch and/or the current mirrors off, thereby providing protection from the detected fault condition.

The over voltage detection 342 (FIG. 3A) measures the supply voltage and sends a signal to a microprocessor or other control system if the supply voltage reaches a given threshold. The switch of the integrated semiconductor device 300 is disabled by the control signals generated by the microprocessor or control system. An exemplary over voltage detection circuit is illustrated generally in FIG. 3B at 350. The OVRV signal is generated when the supply voltage exceeds a reference voltage. The reference voltage is generated internally by the integrated semiconductor device. The supply voltage is scaled in this example.

The STB detection 344 (FIG. 3A) protects the semiconductor device and the supply voltage when the drain to substrate diode of the output transistor of the switch becomes forward biased, a fault condition that may feed current back into the supply voltage. As discussed in more detail with regard to FIG. 5, the transistors in the switch as well as other integrated circuitry provides further protection and is considered, in one embodiment, as part of the STB detection 344. When the voltage at the output of the switch 302 becomes higher than the supply voltage, then the STB detection 344 generates a signal that is used to close the high side switch and the current mirrors. The over current protection 346 uses the current generated by the current mirror 308 to determine when the current in the output of the switch 302 reaches a threshold. If the threshold is reached, the over current protection generates a signal that causes the switch 302 to be turned off.

An example of the STB detection circuit is illustrated in FIG. 3C at 352. The STB detection 352 compares the supply voltage with the output of the switch or the voltage at the load. If the voltage at the load is higher than the supply voltage, then it is possible for current to be fed into the supply, thereby causing damage. This can occur even if the switch is turned off because the diode formed by the drain and the substrate of the output diode can become forward biased, thereby feeding a potentially large current back into the supply. Resistors or transistors can be used to limit the back fed current.

FIG. 3C illustrates that a STB signal is generated when the STB fault occurs. A microprocessor or other control logic, upon receiving the STB signal, causes the control signals to turn the switch and current mirrors off. To properly turn a PMOS transistor off, the gate voltage needs to be tied to the highest potential. Thus, the control signals are at the output of a high output impedance level shifter to prevent the current from being fed back into the control logic or microprocessor.

FIG. 3D illustrates an example of the over current detection 346 shown in FIG. 3A. In this example, the over current detection 354 asserts the OVRC signal if the current generated by the current mirror 308 exceeds a threshold. This can be determined, for example, by a reference voltage that is compared to the voltage at the output of the current mirror 308. The high side switch of the integrated semiconductor device is shut off if this fault condition is detected until the fault condition is resolved. Typically, the current mirrors are also shut off by the control signals.

Figure 4:
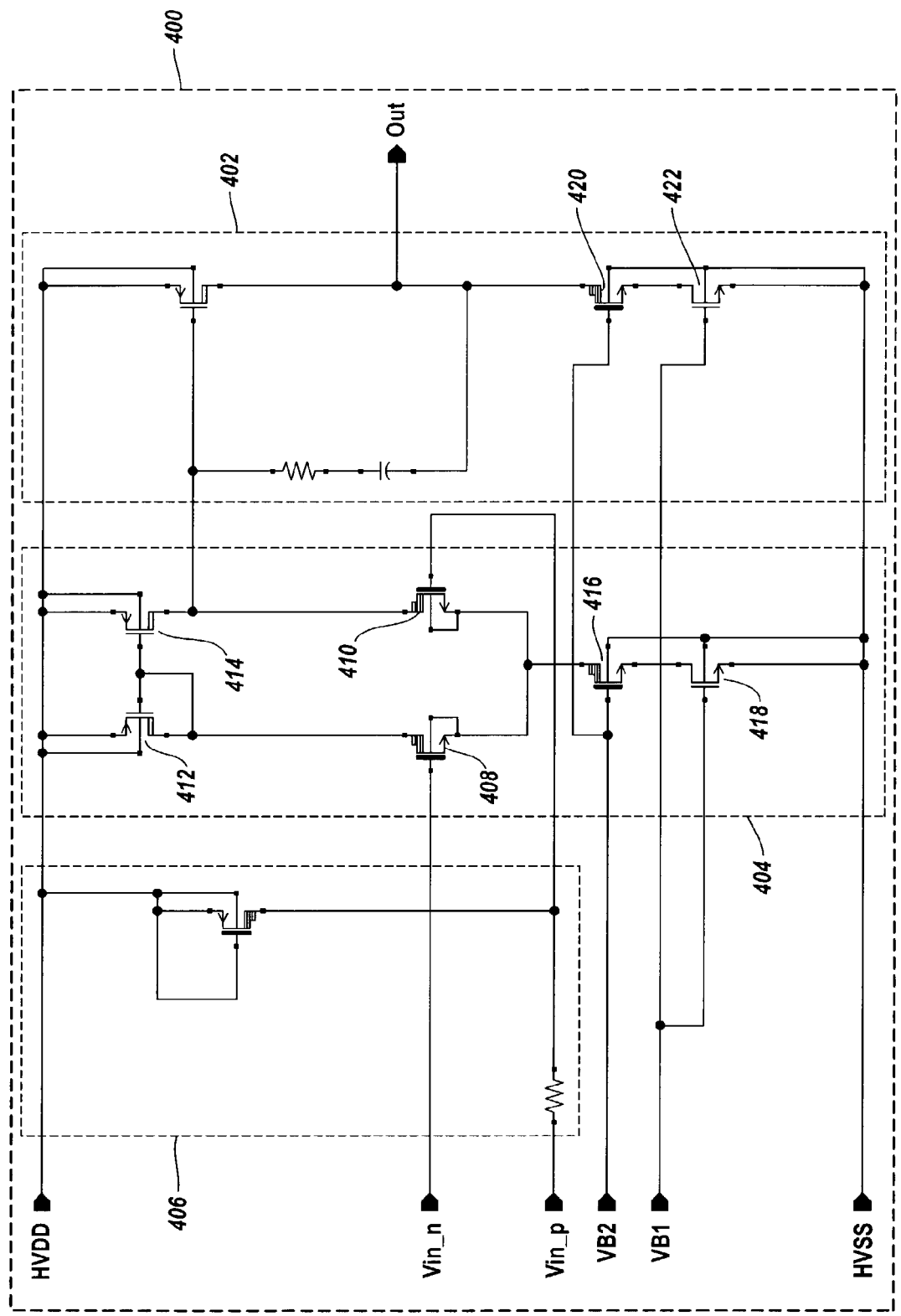
FIG. 4 illustrates one embodiment of operational amplifier that is protected from high voltages.

FIG. 4 illustrates one embodiment of the operational amplifier that is included in the feedback circuitry 314 and 318 of FIG. 3A. In FIG. 3A, the feedback circuit 314 includes an operational amplifier 316 and transistor 317 that regulate the drain voltages of the current mirror 304 and the switch 302. The transistor 317 is connected at the output of the current mirror 304. Similarly, the feedback circuit 318 also includes an operational amplifier 320 and a transistor to monitor the drain voltages at the output of the current mirror 308. The operational amplifiers 316 and 318, in this embodiment, are common mode range biased to the supply voltage.

In FIG. 4, the operational amplifier 400 includes a differential stage 404 and an output stage 402. The transistors 408 and 410 are NMOS transistors in this embodiment. The transistors 412 and 414 permit the input common mode voltages to approach the upper supply. The transistors 412 and 414 also have a high reverse breakdown voltage as added protection to the operational amplifier 400. This is necessary, for example, because the of a low voltage drop across the high side switch. Block 406 protects the input of the transistors 410 and 408 during a STB fault condition. The transistors 416, 418, 420, and 422 are used to bias the operational amplifier 400 and provide a more stable current bias over temperature and process changes.

Figure 5:
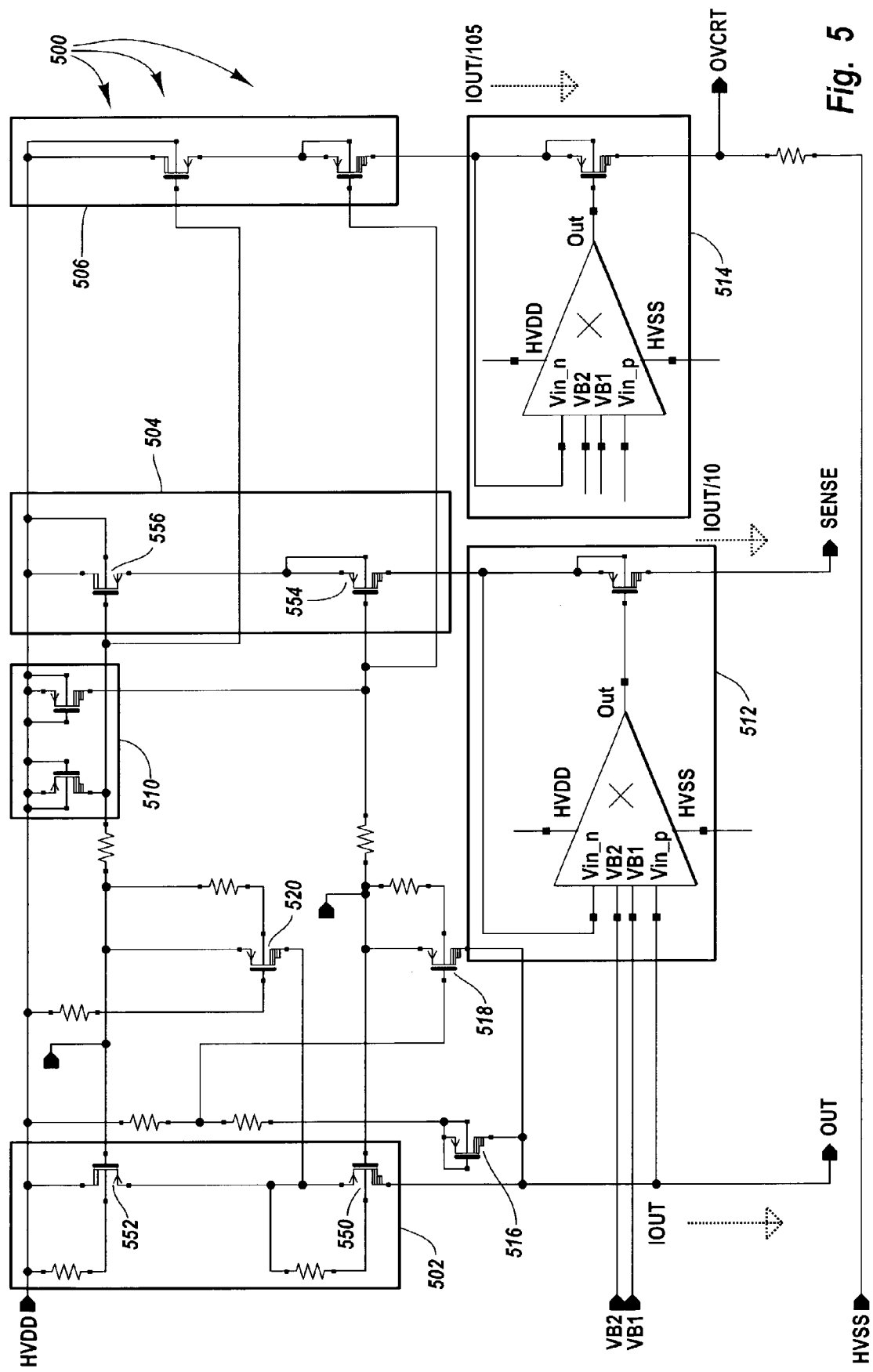
FIG. 5 illustrates another embodiment of a high side switch with fault protection.

FIG. 5 illustrates another embodiment of an integrated semiconductor device that is a multi-fault protected high side switch. The device 500 includes a switch 502, a current mirror 504 and a current mirror 506. The feedback circuits 512 and 514 each include an operational amplifier and a transistor as previously described to insure that the currents generated by the current mirrors are scaled versions of the current delivered through the switch 502.

The transistors 516, 518, and 520 provide protection, for example, in a STB fault condition. The transistor 518, for example, shuts the channel of the transistor 550 when the transistor 518 is on. In other words, the transistor 518 creates a short between the gate and the drain of the transistor 550 when the transistor 518 is on. The transistor 518 also protects the transistor 554. The transistor 520 performs a similar function for the transistors 552 and 556. In addition, the transistors 516, 518, and 520 also protect the current mirror 506.

The transistors 550 and 554, in one embodiment, are lateral DMOS FET transistors that have a gate to drain breakdown voltage of approximately 44 volts and a gate to source breakdown voltage of approximately 13 volts. The transistors 552 and 556 are extended drain PMOS FET transistors that have a gate to drain breakdown voltage of approximately 13 volts sand a gate to source breakdown voltage of approximately 5 volts.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An integrated semiconductor device for use in an electrical system between a power supply and a load such that current is delivered through the integrated semiconductor device to the load, the integrated semiconductor device comprising:
    a switch including:
        a first transistor having a source and a drain, wherein the drain is connected with a supply voltage;
        a second transistor connected in series with the first transistor, wherein a source of the second transistor is electrically connected with the source of the first transistor; and
        one or more control inputs used to receive control signals, wherein the control signals turn the first transistor and the second transistor on and off thereby turning the switch on or off;
        a first resistor having a first terminal coupled to the drain of the first transistor and the supply voltage and having a second terminal coupled to a bulk terminal of the first transistor; and
        a second resistor having a first terminal coupled to the source of the first transistor and the source of the second transistor and having a second terminal coupled to a bulk terminal of the second transistor.

2. An integrated semiconductor device as defined in claim 1, further comprising a current mirror that mirrors a current delivered through the switch, wherein the current mirror is turned on and off by the control signals and includes a third transistor having a source that is connected with a source of a fourth transistor.

3. An integrated semiconductor device as defined in claim 1, further comprising a current mirror that mirrors a current delivered through the switch, and further comprising a feedback circuit connecting an output of the switch with an output of the current mirror, wherein the feedback circuit ensures that an output voltage of the switch is equal to an output voltage of the current mirror such that the current of the current mirror is a scaled version of a current delivered through the switch.

4. An integrated semiconductor device as defined in claim 3, wherein the feedback circuit comprises an operational amplifier and a third transistor, wherein the third transistor in the feedback circuit is electrically connected to the output of the current mirror and wherein an output of the operational amplifier is connected with a gate of the third transistor.

5. An integrated semiconductor device for use in an electrical system between a power supply and a load such that current is delivered through the integrated semiconductor device to the load, the integrated semiconductor device comprising:
 a switch including:
  a lateral DMOS transistor having a source and a drain, wherein the drain is connected with a supply voltage;
  a high voltage extended drain PMOS transistor connected in series with the first transistor, wherein a source of the high voltage extended drain PMOS transistor is electrically connected with the source of the lateral DMOS transistor; and
  one or more control inputs used to receive control signals, wherein the control signals turn the lateral DMOS transistor and the high voltage extended drain PMOS transistor on and off thereby turning the switch on or off.

6. An integrated semiconductor device as defined in claim 1, further comprising a first current mirror that mirrors a current delivered through the switch, and further comprising a second current mirror that mirrors the current delivered through the switch and that delivers a second current for use in detecting an over current fault condition.

7. An integrated semiconductor device as defined in claim 6, wherein the second current mirror comprises a third transistor connected in series with a fourth transistor such that a source of the third transistor is connected with a source of the fourth transistor.

8. An integrated semiconductor device as defined in claim 6, farther comprising a feedback circuit connected between the switch and the second current mirror such that an output voltage of the switch matches an output voltage of the second current mirror.

9. An integrated semiconductor device as defined in claim 8, wherein the feedback circuit comprises an operational amplifier and a third transistor, wherein the third transistor of the feedback circuit is connected to the output of the second current mirror.

10. An integrated semiconductor device for use in an electrical system between a power supply and a load such that current is delivered through the integrated semiconductor device to the load, the integrated semiconductor device comprising:
 a switch including:
  a first transistor having a source and a drain, wherein the drain is connected with a supply voltage;
  a second transistor connected in series with the first transistor, wherein a source of the second transistor is electrically connected with the source of the first transistor; and
  one or more control inputs used to receive control signals, wherein the control signals turn the first transistor and the second transistor on and off thereby turning the switch on or off, and
 a third transistor that shorts the gate and the drain of the second transistor in the switch in a short to battery fault condition.

11. An integrated semiconductor device as defined in claim 10, further comprising a fourth transistor that shorts the gate and drain of the first transistor in the switch in a short to battery fault condition.

12. An integrated semiconductor device that provides protection from multiple fault conditions, the electrical device comprising:
 a switch having a first transistor connected in series with a second transistor, wherein a source of the first transistor is connected with a source of the second transistor, the switch comprising a first resistor having a first terminal coupled to a drain terminal of the first transistor and a supply voltage and having a second terminal coupled to a bulk terminal of the first transistor; and a second resistor having a first terminal coupled to the source of the first transistor and the source of the second transistor and having a second terminal coupled to a bulk terminal of the second transistor;
 a current mirror that generates a current sense output and that mirrors a current delivered through the switch; and
 a feedback circuit connecting an output of the switch with an output of the current mirror such that an output voltage of the switch is equal to an output voltage of the current mirror.

13. An integrated semiconductor device as defined in claim 12, wherein the current mirror comprises a third transistor in series with a fourth transistor, wherein a source of the third transistor is connected with a source of the fourth transistor.

14. An integrated semiconductor device as defined in claim 13, wherein the third transistor and the fourth transistor of the current mirror are PMOS transistors.

15. An integrated semiconductor device as defined in claim 12, wherein the switch is turned on and off using control signals received through control inputs.

16. An integrated semiconductor device as defined in claim 12, wherein the feedback circuit comprises:
 a third transistor electrically connected at an output of the current mirror; and
 an operational amplifier that drives a gate of the third transistor, wherein an output of the current mirror and an output of the switch are input to the operational amplifier.

17. An integrated semiconductor device as defined in claim 12, wherein the current mirror is a first current mirror, the device fUrther comprising a second current mirror that generates a second current that is a scaled version of a current delivered through the switch, wherein the second current is used to detect an over current fault condition.

18. An integrated semiconductor device as defined in claim 17, wherein the feedback circuit is a first feedback circuit, the device further comprising a second feedback circuit connected between the output of the switch and the output of the second current mirror such that a voltage at the output of the switch matches a voltage at the output of the second current mirror.

19. An integrated semiconductor device as defined in claim 18, wherein the second current generates an over current detection signal when the second current exceeds a threshold current, wherein the over current detection signal causes a microprocessor to generate control signals that turn the switch off, the first current mirror off, and the second current mirror off.

20. An integrated semiconductor device as defined in claim 17, wherein the second feedback circuit comprises an operational amplifier and a third transistor.

21. An integrated semiconductor device as defined in claim 17, further comprising a short to battery detection circuit that detects a short to battery fault condition.

22. An integrated semiconductor device as defined in claim 21, wherein the short to battery circuit generates a short to battery signal when a voltage at the output of the switch is greater than the supply voltage, wherein the short to battery signal causes a microprocessor to generate control signals that shut the switch off, the first current mirror off, and the second current mirror off.

23. An integrated semiconductor device as defined in claim 17, further comprising an over voltage circuit that generates an over voltage signal when the supply voltage exceeds a reference voltage, wherein the over voltage signal causes a microprocessor to generate control signals that shut the switch off, the first current mirror off, and the second current mirror off.

24. A high side switch with multi-fault protection, the high side switch comprising:
   a first transistor and a second transistor in series, wherein a drain of the first transistor is connected with a supply voltage and a source of the first transistor is connected with a source of the second transistor, the switch comprising a first resistor having a first terminal coupled to a drain terminal of the first transistor and a supply voltage and having a second terminal coupled to a bulk terminal of the first transistor; and a second resistor having a first terminal coupled to the source of the first transistor and the source of the second transistor and having a second terminal coupled to a bulk terminal of the second transistor;
   a first current mirror that mirrors current delivered through the first and second transistors by generating a first current that is a scaled version of the current delivered through the first transistor and the second transistor, wherein the first current provided as an output of the high side switch;
   a second current mirror that mirrors the current delivered through the first and second transistors by generating a second current that is a scaled version of the current delivered through the first transistor and the second transistor;
   an over current protection circuit that monitors the second current, wherein an over current signal is generated that shuts off the high side switch when the second current exceeds a threshold;
   a short to battery circuit that generates a short to battery signal that shuts off the high side switch when a voltage at the output of the second transistor exceeds the supply voltage; and
   an over voltage current that generates an over voltage signal that shuts off the high side switch when the supply voltage exceeds a threshold voltage.

25. A high side switch as defined in claim 24, wherein the first current mirror comprises:
   a third transistor; and
   a fourth transistor, wherein a source of the fourth transistor is connected in series with a source of the third transistor.

26. A high side switch as defined in claim 24, wherein the second current mirror further comprises:
   a third transistor; and
   a fourth transistor, wherein a source of the fourth transistor is connected in series with a source of the third transistor.

27. A high side switch as defined in claim 24, further comprising:
   a first feedback circuit connected between a drain of the second transistor and an output of the first current mirror such that a voltage at the drain of the second transistor is equal to a voltage at the output of the first current mirror; and
   a second feedback circuit connected between the drain of the second transistor and an output of the second current mirror such that a voltage at the drain of the second transistor is equal to a voltage at the output of the second current mirror.

28. An integrated semiconductor device for use in an electrical system between a power supply and a load such that current is delivered through the integrated semiconductor device to the load, the integrated semiconductor device comprising:
   a switch including:
      a first transistor having a source and a drain, wherein the drain is connected with a supply voltage;
      a second transistor connected in series with the first transistor, wherein a source of the second transistor is electrically connected with the source of the first transistor; and
      one or more control inputs used to receive control signals, wherein the control signals turn the first transistor and the second transistor on and off thereby turning the switch on or off;
   a first resistor having a first terminal coupled to the drain of the first transistor and the supply voltage and having a second terminal coupled to a bulk terminal of the first transistor; and
   a second resistor having a first terminal coupled to the source of the first transistor and the source of the second transistor and having a second terminal coupled to a bulk terminal of the second transistor; and
   a current mirror that mirrors a current delivered through the switch.

29. An integrated semiconductor device that provides protection from multiple fault conditions, the electrical device comprising:
   a switch having a first transistor connected in series with a second transistor, wherein a source of the first transistor is connected with a source of the second transistor;
   a current mirror that generates a current sense output and that mirrors a current delivered through the switch;
   a feedback circuit connecting an output of the switch with an output of the current mirror such that an output voltage of the switch is equal to an output voltage of the current mirror;
   a first resistor having a first terminal coupled to the drain of the first transistor and having a second terminal coupled to a bulk terminal of the first transistor; and
   a second resistor having a first terminal coupled to the source of the first transistor and the source of the second transistor and having a second terminal coupled to a bulk terminal of the second transistor.

30. A high side switch as defined in claim 24, farther comprising:
   a first resistor having a first terminal coupled to the drain of the first transistor and the supply voltage and having a second terminal coupled to a bulk terminal of the first transistor; and
   a second resistor having a first terminal coupled to the source of the first transistor and the source of the second transistor and having a second terminal coupled to a bulk terminal of the second transistor.

* * * * *